United States Patent [19]
Pan

[11] Patent Number: 6,058,131
[45] Date of Patent: May 2, 2000

[54] WAVELENGTH STABILIZATION OF LASER SOURCE USING FIBER BRAGG GRATING FEEDBACK

[75] Inventor: Jing-Jong Pan, Milpitas, Calif.

[73] Assignee: E-Tek Dynamics, Inc., San Jose, Calif.

[21] Appl. No.: 08/971,311

[22] Filed: Nov. 17, 1997

[51] Int. Cl.⁷ ....................................... H01S 3/08
[52] U.S. Cl. ............................. 372/102; 372/34
[58] Field of Search ................... 372/32, 34, 102

[56] References Cited

U.S. PATENT DOCUMENTS

| | | | |
|---|---|---|---|
| 5,299,212 | 3/1994 | Koch et al. | 372/32 |
| 5,313,480 | 5/1994 | Fidric et al. | 372/32 |
| 5,323,409 | 6/1994 | Laskoskie et al. | 372/32 |
| 5,412,676 | 5/1995 | Schnier et al. | 372/32 |
| 5,553,087 | 9/1996 | Telle | 372/32 |
| 5,706,301 | 1/1998 | Lagerstrom | 372/32 |
| 5,715,265 | 2/1998 | Epworth | 372/32 |
| 5,798,859 | 8/1998 | Colbourne et al. | 372/32 |

*Primary Examiner*—Rodney Bovernick
*Assistant Examiner*—Robert E. Wise
*Attorney, Agent, or Firm*—Townsend and Townsend and Crew LLP

[57] ABSTRACT

A laser source with an extremely stable output is provided. A laser diode has an output intensity centered at a peak wavelength which is responsive to a control signal. First and second fiber Bragg gratings are coupled to the laser diode. The first fiber Bragg grating having a reflectivity centered about a first wavelength and the second fiber Bragg grating having a reflectivity centered about a second wavelength different from the first wavelength. Each of the first and second fiber Bragg gratings generates a feedback signal responsive to the reflectivity of the fiber Bragg grating and the output intensity of the laser diode. A controller connected to the laser diode generates the control signal responsive to the feedback signals from the first and second fiber Bragg gratings so that the peak wavelength of the laser diode is maintained at a fixed wavelength between the first and second wavelengths.

31 Claims, 6 Drawing Sheets

WAVELENGTH STABILIZATION OF LASER SOURCE USING FIBER BRAGG GRATING FEEDBACK

BACKGROUND OF THE INVENTION

The present invention is related to the field of fiberoptic network laser sources and, more particularly, to laser diode sources having very high spectral stability.

In many fields of optics, such as precision optical instruments, optical telemetry (remote) sensing systems, high performance optical sensors and the like, laser sources having a high degree of spectral stability are very desirable. With such sources, the wavelength (or frequency) of the laser light output varies little with changing conditions. Perhaps the field with the most pressing need, at least in terms of numbers, for a laser source with a stable spectral output is the Dense WDM (DWDM) fiberoptic network.

In WDM (Wavelength Division Multiplexed) networks, the wavelength of an optical signal is used to direct the signal from its source to its destination. Each network user typically has a laser source operating at a specific wavelength which is different from those of other laser sources. Hence a stable laser source having a fixed output wavelength is desirable. As the number of users on a WDM network increases, a larger number of laser sources are required for signal generation. The large bandwidth networks, such as DWDM networks, increase the demand for highly stabilized laser sources.

To increase the bandwidth and the number of communication channels in WDM networks, the ITU, the International Telecommunications Union, has proposed the Dense WDM, or DWDM. The separation between communication channels in the DWDM is only 0.8 nm, or 100 GHz in frequency. Thus a light source for such a network must also have a very narrow output linewidth, i.e., the wavelength of the output signal must be concentrated in a very narrow portion of the optical spectrum, and the wavelength of the source must be extremely stable to avoid drifting into the wavelength range of another channel.

Figure 1:
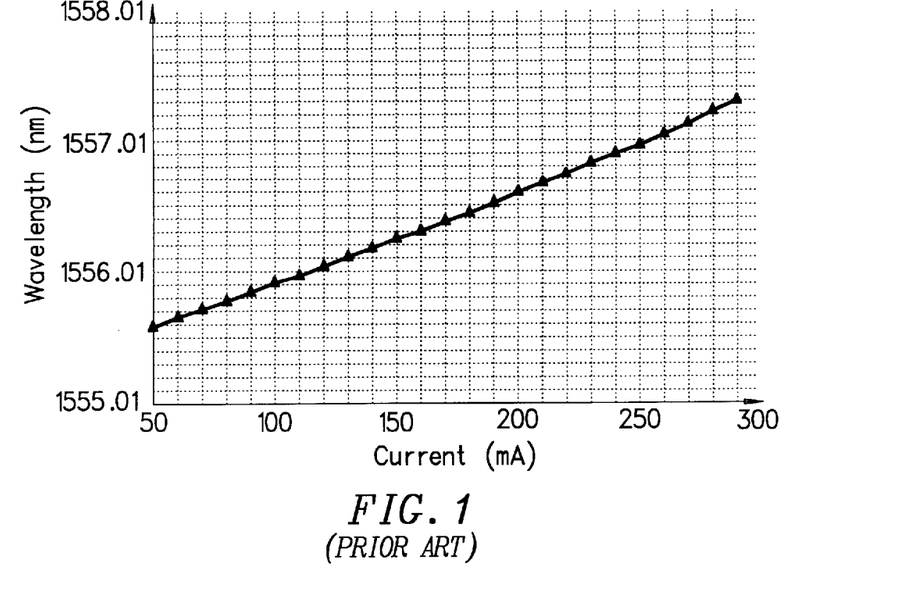
FIG. 1 is a graph of wavelength versus bias current for a present day DFB laser diode.

In present laser sources, such as DFB (Distributed Feedback), DBR (Distributed Bragg Reflectors) or Fabry-Perot laser diode laser sources, the output wavelength changes in varying degrees with changes in the bias current of the laser diode and changes in temperature. FIG. 1, for instance, illustrates the changes in spectral output in response to changes in the bias current for a modern DFB laser diode. Various techniques are used to stabilize the bias current and temperature of the laser diode. However, conventional bias current and temperature stabilization are inadequate for the stringent requirements for many optical systems, such as DWDM networks.

The present invention provides for such a laser source with an output which is very stable.

SUMMARY OF THE INVENTION

The present invention provides for a laser source with an extremely stable output. The laser source has a laser diode which is connected to an output optical fiber. The laser diode has an output intensity centered at a peak wavelength which is responsive to a control signal. First and second fiber Bragg gratings are coupled to the laser diode with the first fiber Bragg grating having a reflectivity centered about a first wavelength and the second fiber Bragg grating having a reflectivity centered about a second wavelength different from the first wavelength. Each of the first and second fiber Bragg gratings generates a feedback signal responsive to the reflectivity of the fiber Bragg grating and the output intensity of the laser diode. A controller connected to the laser diode generates the control signal responsive to the feedback signals from the first and second fiber Bragg gratings so that the peak wavelength of the laser diode is maintained at a wavelength between the first and second wavelengths.

DETAILED DESCRIPTION OF SPECIFIC EMBODIMENTS

It should be noted that the same reference numerals are sometimes used for elements in a different drawings to emphasize that the elements have substantially the same function or operation to better explain the different aspects of the present invention.

Figure 2A:
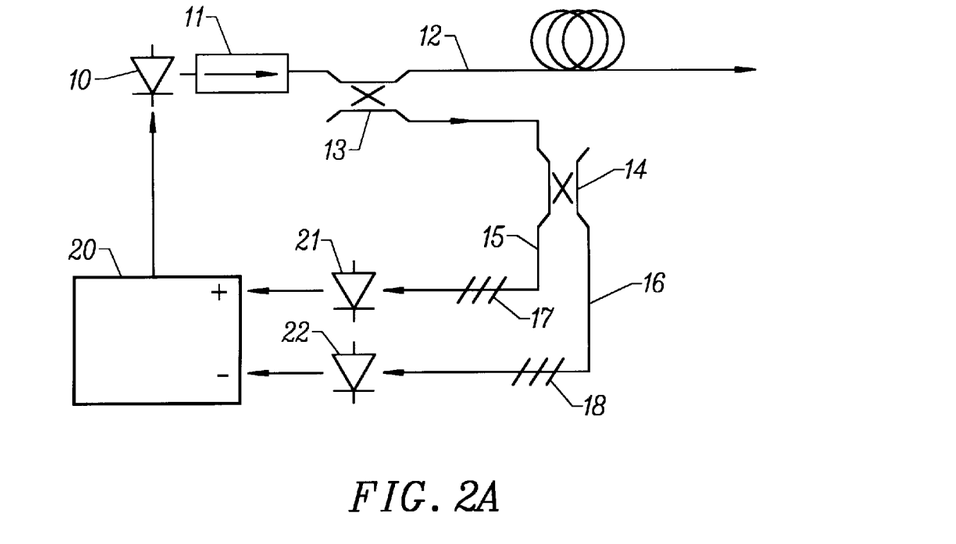
FIG. 2A is a schematic diagram of a laser source according to one embodiment of the present invention.

FIG. 2A is a schematic representation of a laser source according to one embodiment of the present invention. The output light from a laser diode 10 is passed to an output fiber 12 through an optical isolator 11. The laser source also has an optical coupler 13 which diverts a small portion of the output light from the output fiber 12 toward a second coupler 14. For example, an output ratio of 9:1 in favor of the output fiber 12 has been found to work effectively. Such couplers are known in optical fiber practice. For example, optical fibers with unevenly stretched cores and claddings may be twisted together to form the coupler. On the other hand, the optical coupler 14 splits the received light evenly into two optical fibers 15 and 16, each of which has fiber Bragg gratings 17 and 18, respectively. A so-called "3 dB" twisted pair coupler may be used for the optical coupler 14.

A photodiode 21 receives light which has passed through the fiber Bragg grating 17 and a photodiode 22 receives light which has passed through the fiber Bragg grating 18. The output of these photodiodes 21 and 22 is sent to an amplifier/controller unit 20, which generates a feedback control signal for the laser diode 10. Responsive to the differences in output signals from the photodiodes 21 and 22, the control signal works in a negative feedback mode to maintain the output from the diode 10 centered at the desired wavelength.

Figure 2B:
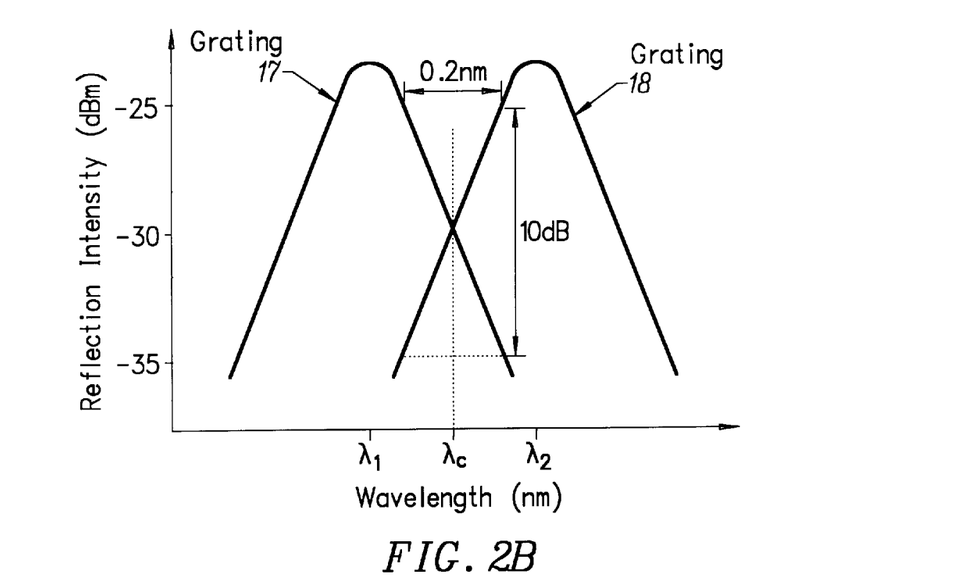
FIG. 2B is a representative plot of reflection intensity versus wavelength of the fiber Bragg gratings of the laser source of FIG. 2A.

The FIG. 2B graph of reflection intensity versus wavelength illustrates an idealized performance of the two fiber Bragg gratings 17 and 18. Fiber Bragg gratings are created by a periodic or near periodic variation in the index of refraction in the core of an optical fiber and may have extremely sharp and narrow peaks in reflectivity with respect to wavelength. As shown in the graph of FIG. 2B, the grating 17 has a reflectivity peak at wavelength $\lambda_1$ and grating 18 has a reflectivity peak at wavelength $\lambda_2$. The gratings 17 and 18 are designed such that the peak wavelengths $\lambda_1$ and $\lambda_2$ are separated so that the intensity of the light received by the photodiodes 21 and 22 as modified by the fiber Bragg gratings 17 and 18 are responsive to different parts of the optical spectrum. Hence, as shown in FIG. 2B, the peak wavelengths $\lambda_1$ and $\lambda_2$ are separated to define an intermediate center wavelength $\lambda_C$ where the reflection intensities of the two gratings 17 and 18 are equal. At this output wavelength of the laser diode 10, the photodiodes 21 and 22 detect equal power. The difference in the two reflection intensities about the central wavelength $\lambda_C$ is used to lock in the output of the laser diode 10. For example, if the signal of the photodetector 21, which is connected to one (positive) of the input terminals of the amplifier/controller unit 20, is stronger than the signal from the photodetector 22, which is connect to the other (negative) input terminal, then the output wavelength of the laser diode 10 is shorter than $\lambda_C$. The amplifier/controller unit 20, operating as a comparator, generates a positive signal to the laser diode 10 to increase its output wavelength. Likewise, if the output wavelength is longer than $\lambda_C$, then the amplifier/controller unit 20 generates a negative signal to the laser diode 10 to decrease its output wavelength. By this feedback loop, the amplifier/controller 20 operates to maintain the output of the laser diode 10 so that the signals received from the photodiodes 21 and 22 are substantially equal.

Figure 2C:
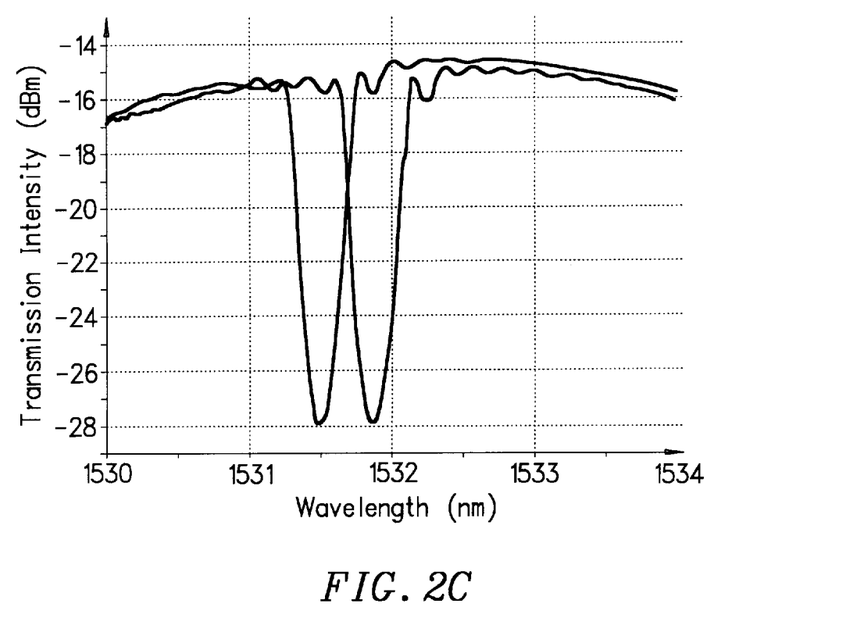
FIG. 2C is a graph of transmission intensity versus wavelength of exemplary fiber Bragg gratings for the laser source of FIG. 2A.

Note that while the gratings 17 and 18 are discussed in terms of reflection intensities, they also form transmission intensities versus wavelength as shown in FIG. 2C. In other words, as shown in the arrangement of FIG. 2A, the actual light intensity as received by each of the photodiodes 21 and 22, have minimums at spaced apart wavelengths, specifically $\lambda 1$ and $\lambda 2$. The two transmission intensities of the gratings 17 and 18 are equal at $\lambda_C$ where the laser diode 10 is locked. As shown in FIG. 2C, actual wavelengths for fiber gratings are indicated. In this case, the reflection intensities are centered about 1531.5 nanometers and 1531.85 nanometers.

Figure 3A:
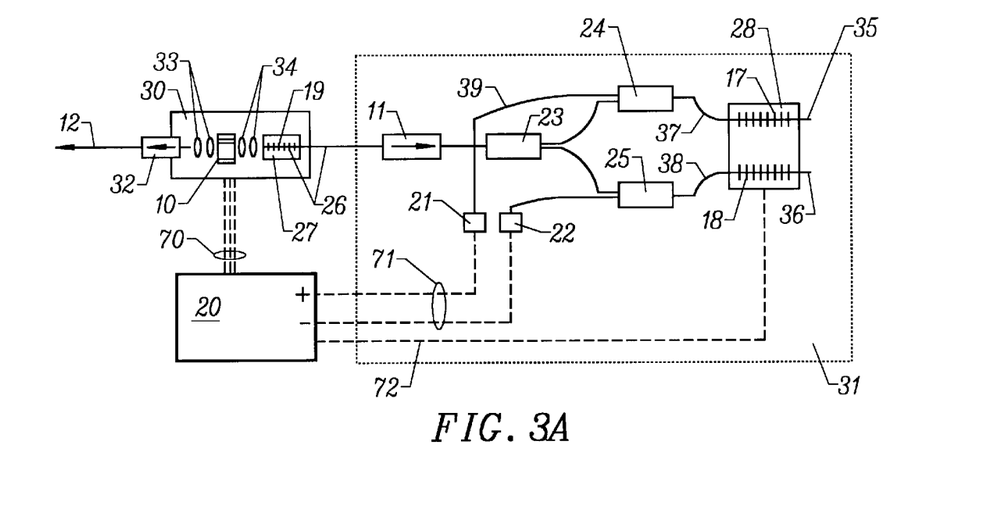
FIG. 3A is a more detailed diagram of a laser source according to the present invention.

FIG. 3A illustrates a laser diode source in greater detail, according to another embodiment of the present invention. The laser diode source is formed by a laser diode module 30, an optical feedback module 31 generates a control signal from the output light of the module 30, and the amplifier/controller block 20 which receives the control signal from the optical feedback module 31 to control the output of the laser diode module 30.

The laser diode module 30 has the laser diode 10 with a lens system 33 which collimates the output light from one facet of the laser diode 10 for an optical isolator 32. A second lens system (not shown) focusses the collimated light from the isolator 32 into the output fiber 12. On the other side of the laser diode 10, a second lens system 34 focuses the output light from the second facet of the laser diode 10 into an optical fiber section 26 in which a fiber Bragg grating 19 is formed. The narrow reflection bandwidth of the fiber Bragg grating 19 narrows the output of the laser diode 10 such that the reflection peak of the fiber Bragg grating 19 defines the output wavelength of the laser diode 10.

Also part of the laser diode module 30 is a temperature-control unit 27 to which the optical fiber section 26 is fixed. Despite changes in the ambient temperature of the module 30, the temperature control by the unit 27 controls the effective index refraction of the core of the section 26, the expansion of the section 26 and the fiber Bragg grating period $\Lambda$. Changes to the period $\Lambda$ causes shifts in the wavelength of reflectivity peaks of the fiber Bragg grating. Thermoelectric modules have proved to be effective as temperature-control units in providing such temperature control of optical fiber sections and fiber Bragg gratings.

The optical feedback module 31 has the optical isolator 11 which is connected to the optical fiber section 26 from the module 30. The optical feedback module 32 also has optical couplers 23, 24 and 25, and photodiodes 21 and 22. The optical isolator 11 is connected to the optical coupler 23 which, in turn, is connected to the optical couplers 24 and 25. The optical coupler 24 is connected to an optical fiber 37 which contains the fiber Bragg grating 17, and to an optical fiber 39 which is connected to the photodiode 21. The optical coupler 25 is connected to an optical fiber 38 which has the fiber Bragg grating 18, and to an optical fiber 29 which is connected to the photodiode 22. The ends of the optical fibers 37 and 38 are respectively terminated by end sections 35 and 36, which are slanted at an angle and coated with antireflection material. Light which is not reflected by the fiber Bragg gratings 17 and 18 is transmitted through the terminals 35 and 36, rather than being reflected back. The operation of the couplers 24 and 25 is such that upon reflection by the fiber Bragg gratings 17 and 18, light is passed back to the fibers 39 and 29, and to the photodiodes 21 and 22 respectively. The optical isolator 11 prevents any light which is also reflected back into the coupler 23 from reaching the laser diode module 30.

The portions of the optical fibers 37 and 38 which hold the fiber Bragg gratings 17 and 18 are also fixed to a temperature-control unit 28. As discussed previously with respect to the fiber Bragg grating 19, the temperature-control unit 28 controls the performance of the fiber Bragg gratings 17 and 18, despite variations in ambient temperature.

The feedback signals from the photodiodes 21 and 22 are connected back by lines 71 into the amplifier/controller block 20. The block 20 then adjusts the bias current to the laser diode 10 (and its cooling since the laser diode 10 is also mounted to a temperature-control unit(not shown)) and controls the operation of the temperature-control unit 27 for the fiber Bragg grating 19. The block 20 communicates to the module 30 through lines 70. The block 20 also controls the operations of the temperature control units 28 through a line 72 to set the temperatures for the fiber Bragg gratings 19 and 17 and 18. It should be noted that in the drawings lines carrying optical signals, i.e., optical fibers, are represented by solid lines and lines carrying electrical signals are represented by dashed lines.

The amplifier/controller block 20 controls many elements which can affect the output wavelength of the laser diode 10. The laser output is maintained at a constant wavelength in spite of changing conditions. Conversely, the elements, under the control of the block 20, can be used to vary the output wavelength. One example of this type of operation is disclosed below.

Figure 3B:
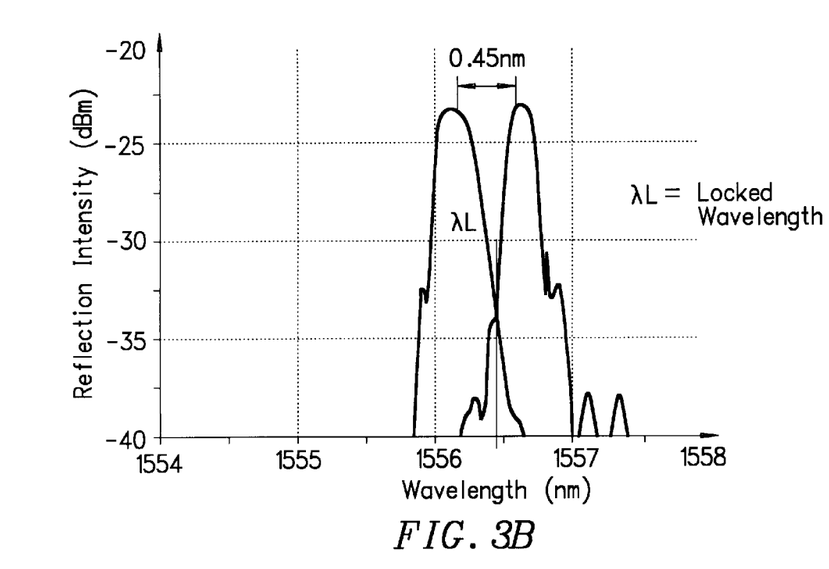
FIG. 3B is a graph of reflection intensity versus wavelength of the exemplary fiber Bragg gratings for the laser source of FIG. 3A.

FIG. 3B illustrates the reflection intensity versus wavelength for two fiber Bragg gratings which may be used for the gratings 17 and 18. As shown, the peaks of the reflection intensities of the two fiber Bragg gratings are separated by 0.45 nanometers between which a wavelength $\lambda_L$ to which the output wavelength of the laser diode is locked by the feedback operations of the module 32 and amplifier/controller block 20.

Figure 4:
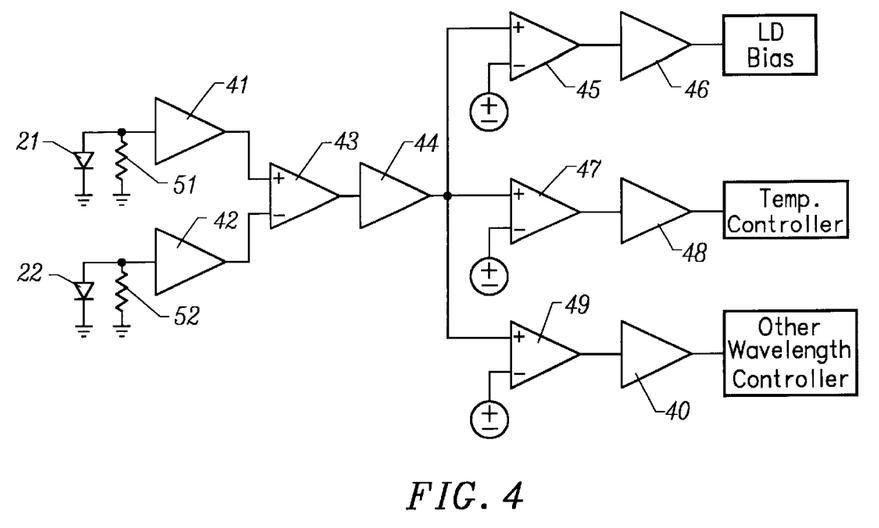
FIG. 4 is a schematic diagram of controller block of the laser source of FIG. 3A.

FIG. 4 illustrates a block diagram of the amplifier/controller block 20. The block 20 is formed by amplifiers 40–42, 44–49 and a comparator 43. As shown, the photodiode 21 is connected across a resistor 51 and to one input terminal of the amplifier 41. Likewise, the photodiode 22 is connected across a resistor 52 to an input terminal of the amplifier 42. The outputs of the amplifiers 41 and 42 are fed into the terminals of a comparator amplifier 43 whose output is connected to the input of a main amplifier 44. The output of the amplifier 44 is then connected to the input terminals of buffer amplifiers 45, 47 and 49. Each of these amplifiers 45, 47 and 49 has a second terminal connected to a reference voltage. The output of the amplifier 45 is connected to a driver amplifier 46 which, in turn, drives the bias current to the laser diode 10. The output of the buffer amplifier 47 is connected to a driver amplifier 48 whose output terminal is connected to the temperature-control units 27 and 28. The amplifier 49 has its output connected to the driver amplifier 40 which drives other wavelength controller functions. For example, in the embodiments illustrated in FIGS. 3A and 6A, besides bias current and temperature, the output of the driver amplifier 40 could be used to stretch or compress the fiber Bragg gratings 19, 69A, 69B and 69C by piezoelectric transducers to control the wavelength of the laser diode output.

As discussed above, the reflection intensities of the two fiber Bragg gratings 17 and 18 used in the feedback loop have extremely narrow bandwidths. If, by chance, the output of the laser diode 10 falls outside of the range between the peaks of these two fiber Bragg gratings 17 and 18, there is a problem of returning the output of the laser diode 10 into the center or locked wavelength. Rather than two fiber Bragg gratings, four feedback fiber Bragg gratings are used to address this problem.

Figure 5A:
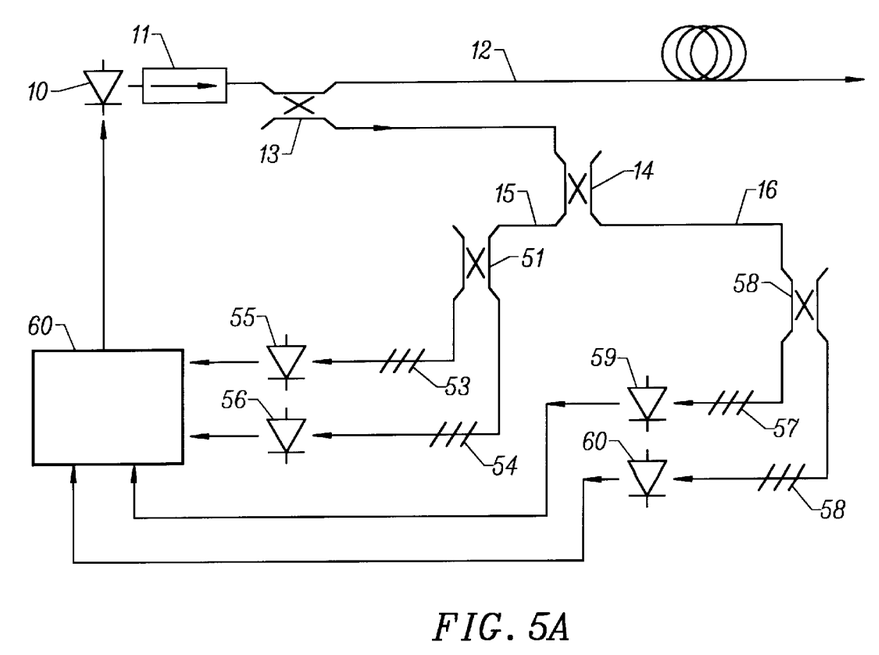
FIG. 5A is a diagram of a laser source according to another embodiment of the present invention.

The arrangement shown in FIG. 5A illustrates the operation of this aspect of the present invention. In this embodiment, the output of the laser diode 10 is again received by the optical isolator 11 which is connected to the output fiber 12. The optical coupler 13, which taps off a small amount of the laser diode 10 output, sends the tapped output intensity to the optical coupler 14, which splits the two light intensities into optical fibers 15 and 16. The optical fiber 15 is in turn connected to a coupler 51 which splits the output further into two optical fiber sections which each contain one of two fiber Bragg gratings 53 and 54. Likewise, the optical fiber 16 is connected to a coupler 58 which splits the incoming light into two optical fiber sections which each contain one of two fiber Bragg gratings 57 and 58. The outputs through the fiber Bragg gratings 53 and 54 are received by photodiodes 55 and 56 respectively. The output signals from the photodiodes 55 and 56 are fed into the amplifier/control block 60. The outputs through the fiber Bragg gratings 57 and 58 are received by the photodiodes 59 and 61 which, in turn, send their outputs to the amplifier/control block 60. The amplifier/control block 60 then sends back a feedback signal back to the laser diode 10.

Figure 5B:
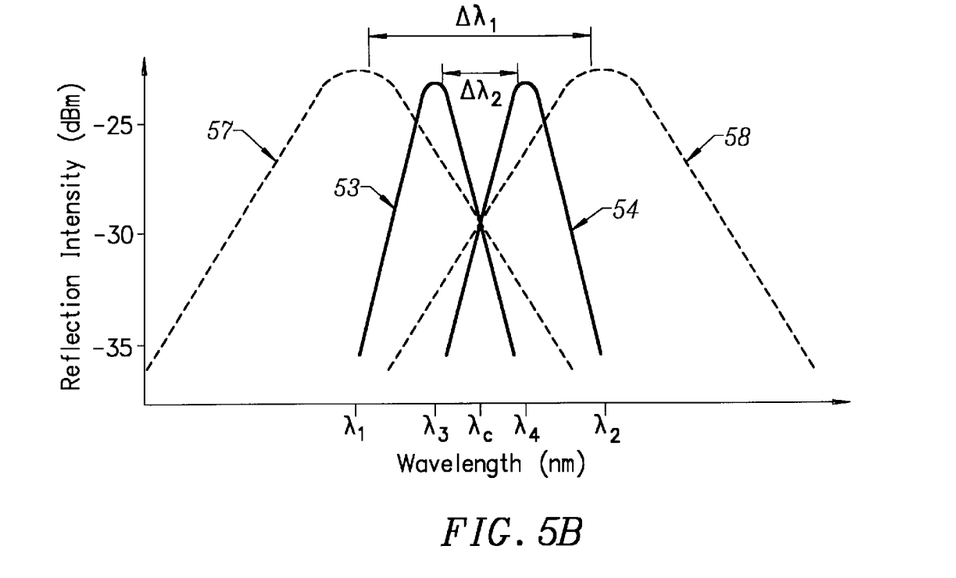
FIG. 5B is a representative plot of reflection intensity versus wavelength of the fiber Bragg gratings of the laser source of FIG. 5A.

FIG. 5B illustrates the reflection intensities of the pairs of fiber Bragg gratings 53 and 54, and 57 and 58. The fiber Bragg gratings 53 and 54 operate as discussed above, i.e., their peak reflection intensities are separated very narrowly to define a wavelength range $\Delta\lambda_2$ about the center wavelength $\lambda_C$, as shown in FIG. 5B. The fiber Bragg gratings 57 and 58 have their peak intensities separated by a far greater range $\Delta\lambda_1$, which is also centered around the center wavelength $\lambda_C$. When the output of the laser diode 10 falls outside the $\Delta\lambda_2$ range, the amplifier/control block 60 relies upon the feedback signals from the laser diodes 57 and 58 with the wider wavelength range $\Delta\lambda_1$ to push the output of the laser diode 10 back toward the center wavelength $\lambda_C$. When the output of the laser diode 10 returns to the wavelength range $\Delta\lambda_2$, the amplifier/control block 60 relies upon the feedback signals from the Bragg gratings 53 and 54 to center the laser diode output at $\lambda_C$ much more precisely and quickly. The feedback operations return to normal as have been described previously.

Figure 6A:
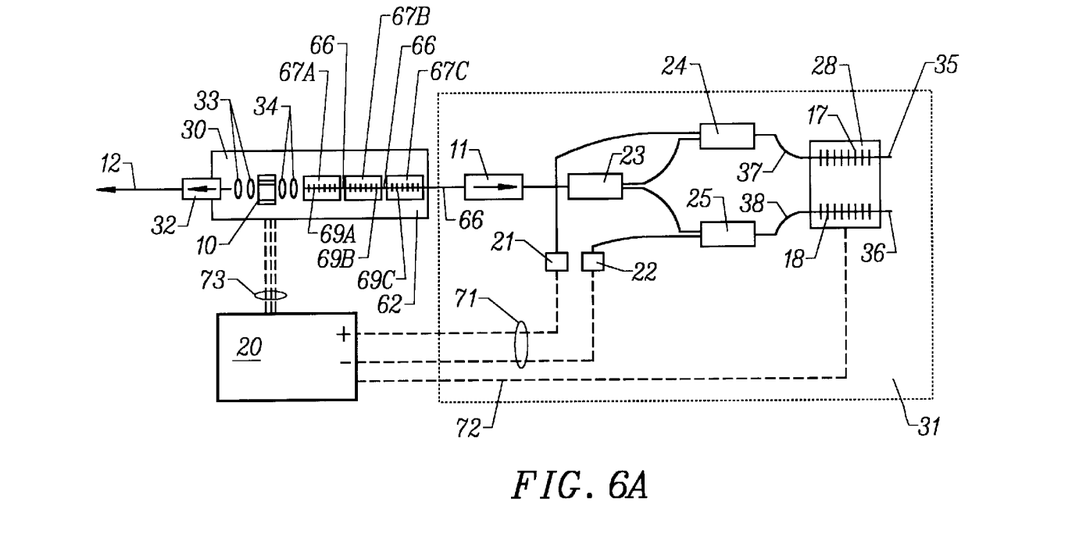
FIG. 6A is a diagram of a laser source according to another embodiment of the present invention.

FIG. 6A details an arrangement similar to the arrangement in FIG. 3A. As described previously, the forward output of the laser diode 10 is collimated by the lens system 33 for the optical isolator 32. Eventually the output optical fiber 12 receives the forward output. However, instead of a single fiber Bragg grating at the back facet of the laser diode 10, the laser diode module 62 has an optical fiber section 66 with three reflective fiber Bragg gratings 69A, 69B and 69C. The backward output of the laser diode 10 is focussed by the lens system 34 into an end of the optical fiber section 66 which has its opposite end connected to an optical isolator 11 of the optical feedback block 31. As described previously, the couplers 24 and 25 pass the light reflected by the fiber Bragg gratings 17 and 18 back to the fibers 39 and 29, and to the photodiodes 21 and 22 respectively. The outputs of the photodiodes 21 and 22 are fed back into the amplifier/control block 20 which adjusts the bias current (and operating temperature) of the laser diode 10 and the temperatures of the fiber Bragg gratings 69A–69C through lines 73. The amplifier/control block 20 also controls the temperature of the fiber Bragg gratings 17 and 18 through the line 72.

Figure 6B:
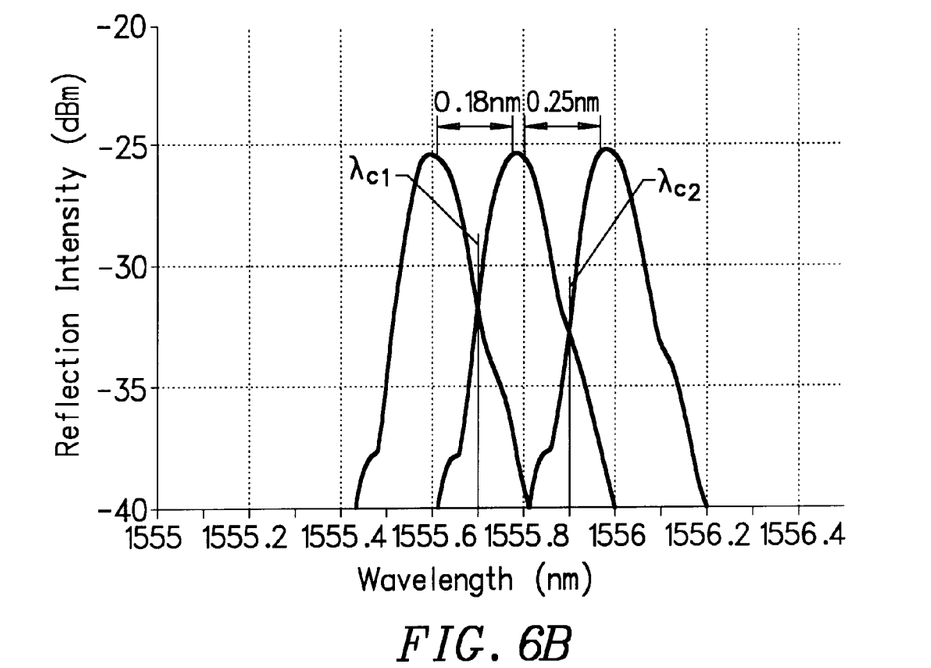
FIG. 6B is a representative plot of reflection intensity versus wavelength of the fiber Bragg gratings of the laser source of FIG. 6A.

FIG. 6B illustrates the reflection intensities of the fiber Bragg gratings 69A–69C. Each of the reflection intensity peaks of the fiber Bragg gratings 69A–69C defines an output wavelength for the laser diode 10. Each of the portions of the optical fiber section 66 containing the fiber Bragg gratings 69A–69C is fixed to its own temperature control unit 67A–67C respectively. Through the lines 73, the amplifier/control block 20 can set the temperature of each of the temperature control units 67A–67C and, hence, of the corresponding fiber Bragg gratings 69A–69C. As explained above, the period A of a fiber Bragg grating and the effective refractive index of the fiber core define the central wavelength of the reflection spectrum of the fiber Bragg grating and is affected by the temperature of the grating. Hence the amplifier/control block 20 can control the output wavelengths of the laser diode 10 separately through the lines 73 by the individual operation of each of the temperature control units 67A–67C. Overall control of the output of the laser diode 10 is effected by the optical feedback block 31 and its fiber Bragg gratings 17 and 18, as explained previously.

To control three output wavelengths independently, three pairs of fiber Bragg gratings are required for a separate feedback signal for each of the three output wavelengths. Each fiber Bragg grating pair controls one output wavelength by a corresponding control of the temperature of a grating 69A, 69B or 69C. Three partial optical feedback blocks 31, connected in parallel to the optical isolator 11 to receive light signals from the laser diode 10, for instance, can be used for separate control of the temperature-control unit 67A–67C. Each feedback block 31 is modified so that its corresponding fiber Bragg gratings 17 and 18 are centered about a $\lambda_C$ which is one of the desired output wavelengths.

While the description above provides a full and complete disclosure of the preferred embodiments of the present invention, various modifications, alternate constructions, and equivalents will be obvious to those with skill in the art. Thus, the scope of the present invention should be limited solely by the metes and bounds of the appended claims.

What is claimed is:

1. A laser source comprising a laser diode having an output intensity peaking at an operating wavelength, said operating wavelength responsive to a first control signal;

first and second fiber Bragg gratings coupled to said laser diode, said first fiber Bragg grating having a maximum reflectivity at a first wavelength, said second fiber Bragg grating having a maximum reflectivity at a second wavelength displaced from said first wavelength, each of said first and second fiber Bragg gratings generating a feedback signal responsive to said maximum reflectivity of said fiber Bragg grating and said output intensity of said laser diode, said first and second fiber Bragg gratings are fixed to a temperature-control unit, said temperature-control unit responsive to a second control signal; and a controller connected to said laser diode and generating said first control signal responsive to said feedback signals from said first and second fiber Bragg gratings and said second control signal to maintain said operating wavelength of said laser diode at a selected wavelength between said first and second wavelengths.

2. The laser source of claim 1 comprising a first coupler connected to said laser diode, said first coupler tapping a predetermined fraction of output power from said laser diode for said first and second fiber Bragg gratings.

3. The laser source of claim 2 wherein said predetermined fraction of said output power is much smaller than ½.

4. The laser source of claim 3 wherein said predetermined fraction of said output power is less than ⅟₁₀.

5. The laser source of claim 2 comprising a second coupler connected to said first coupler, said second coupler splitting said predetermined fraction of output power from said first coupler into substantially equal fractions, each substantially equal fractions being received by one of said first and second fiber Bragg gratings.

6. The laser source of claim 2 comprising a second coupler connected to said first coupler, said second coupler splitting said predetermined fraction of output power from said first coupler into substantially equal first fractions; and third and fourth couplers connected to said second coupler, said third and fourth coupler each receiving said substantially equal first fraction and each splitting said substantially equal first fraction from said second coupler into substantially equal second fractions, said substantially equal second fractions from said third coupler being received by said first and second fiber Bragg gratings.

7. The laser source of claim 6 further comprising third and fourth fiber Bragg gratings each receiving said substantially equal second fractions from said fourth coupler, said third fiber Bragg grating having a maximum reflectivity at a third wavelength, said fourth fiber Bragg grating having a maximum reflectivity at a fourth wavelength displaced from said third wavelength to define a second wavelength range, said second wavelength range encompassing a first wavelength range defined by said displacement of second wavelength from said first wavelength, each of said third and fourth fiber Bragg gratings generating a feedback signal responsive to said maximum reflectivity of said fiber Bragg grating and said output intensity of said laser diode; and wherein said controller generates said control signal responsive to said feedback signals from said third and fourth fiber Bragg gratings to maintain said operating wavelength between said third and fourth wavelengths when said operating wavelength is in said second wavelength range but not in said first wavelength range.

8. The laser source of claim 1 wherein said first fiber Bragg grating feedback signal corresponds to an output intensity of said laser diode at said first wavelength; said second fiber Bragg grating feedback signal corresponds to an output intensity of said laser diode at said second wavelength.

9. The laser source of claim 8 wherein said controller generates said control signal to equalize said output intensities of said laser diode at said first and second wavelengths.

10. A laser source comprising a laser diode having an output intensity peaking at an operating wavelength defined by a first fiber Bragg grating coupled to said laser diode, said first fiber Bragg grating mounted to a first temperature-control unit, said first temperature-control unit controlling a period of said first fiber Bragg grating and said operating wavelength responsive to a first control signal;

a pair of second fiber Bragg gratings coupled to said laser diode, a first of said second Bragg grating pair having a maximum reflectivity at a first wavelength, a second of said second fiber Bragg grating pair having a maximum reflectivity at a second wavelength displaced from said first wavelength, each of said pair of said second fiber Bragg gratings generating a feedback signal responsive to said maximum reflectivity of said respective second fiber Bragg gratings and said output intensity of said laser diode; and a controller connected to said laser diode and generating said first control signal responsive to said feedback signals from said second fiber Bragg grating pair to maintain said operating wavelength at a selected wavelength between said first and second wavelengths.

11. The laser source of claim 10 wherein said controller generates a second control signal responsive to said feedback signals from said second fiber Bragg grating pair, said second control signal affecting a bias current to said laser diode to maintain said operating wavelength at said selected wavelength.

12. The laser source of claim 11 wherein said pair of second fiber Bragg gratings are fixed to a second temperature-control unit, said second temperature-control unit controlling periods of said pair of second fiber Bragg gratings and said first and second wavelengths responsive to a third control signal said control unit generating said third control signal to maintain said first and second wavelengths at a constant wavelength.

13. The laser source of claim 10 wherein a first of said second fiber Bragg gratings feedback signal corresponds to an output intensity of said laser diode at said first wavelength; a second of said second fiber Bragg gratings feedback signal corresponds to an output intensity of said laser diode at said second wavelength.

14. The laser source of claim 13 wherein said controller generates said control signal to equalize said output intensities of said laser diode at said first and second wavelengths.

15. The laser source of claim 10 wherein said laser diode has a first facet and a second facet, said first facet coupled to an output optical fiber and said second facet coupled to an optical fiber section having said first fiber Bragg grating.

16. The laser source of claim 15 wherein said optical fiber section is further coupled to a first coupler splitting said output intensity from laser diode and said first fiber Bragg grating into substantially equal fractions, each substantially equal fraction being received by one of said second fiber Bragg grating pair.

17. A laser source comprising
a laser diode having an output intensity peaking at a plurality of operating wavelengths defined by a plurality of first fiber Bragg gratings coupled to said laser diode, each of said first fiber Bragg gratings mounted to one of a plurality of first temperature-control units, each of said first temperature-control units controlling a period of one of said first fiber Bragg gratings and a corresponding operating wavelength responsive to one of a plurality of first control signals;
a plurality of pairs of second fiber Bragg gratings coupled to said laser diode, each pair including one of said second fiber Bragg gratings having a maximum reflectivity at a first wavelength, and another second fiber Bragg grating having a maximum reflectivity at a second wavelength displaced from said first wavelength to define a wavelength range encompassing one of said operating wavelengths, each of said second fiber Bragg gratings of each pair generating a feedback signal responsive to said maximum reflectivity of said respective second fiber Bragg grating and said output intensity of said laser diode; and
a controller connected to said laser diode and generating said plurality of first control signals responsive to said feedback signals from said plurality of second fiber Bragg gratings, each one of said plurality of said first control signals maintaining one of said operating wavelengths at a selected wavelength in a wavelength range of a pair of second fiber Bragg gratings.

18. The laser source of claim 17 wherein said controller generates a second control signal responsive to said feedback signals from said second fiber Bragg grating pairs, said second control signal controlling a bias current to said laser diode to maintain said operating wavelengths at said selected wavelengths.

19. The laser source of claim 17 wherein each pair of second fiber Bragg gratings is fixed to one of a plurality of second temperature-control units, each said second temperature-control unit controlling periods of said fixed pair of second fiber Bragg gratings responsive to one of a plurality of third control signals said controller generating said third control signals to maintain to maintain one of said operating wavelengths at one of said selected wavelengths.

20. The laser source of claim 17 wherein said first of said second fiber Bragg grating pair feedback signal corresponds to an output intensity of said laser diode at said first wavelength; said second of said second fiber Bragg grating pair feedback signal corresponds to an output intensity of said laser diode at said second wavelength.

21. The laser source of claim 20 wherein said controller generates said first control signal to equalize said output intensities of said laser diode at said first and second wavelengths.

22. The laser source of claim 17 wherein said laser diode has a first facet and a second facet, said first facet coupled to an output optical fiber and said second facet coupled to an optical fiber section having said plurality of said first fiber Bragg gratings.

23. The laser source of claim 22 wherein said optical fiber section is further coupled to at least one first coupler splitting said output intensity from laser diode and said plurality of first fiber Bragg gratings into fractions, and a plurality of second couplers, each second coupler splitting a fraction into substantially equal portions, each substantially equal portion being received by one of said second fiber Bragg grating pair.

24. A laser source comprising
a laser diode having an output intensity peaking at an operating wavelength, said operating wavelength responsive to a control signal;
first and second fiber Bragg gratings coupled to said laser diode, said first fiber Bragg grating having a maximum reflectivity at a first wavelength, said second fiber Bragg grating having a maximum reflectivity at a second wavelength displaced from said first wavelength to define a first wavelength range, each of said first and second fiber Bragg gratings generating a feedback signal responsive to said maximum reflectivity of said fiber Bragg grating and said output intensity of said laser diode;
third and fourth fiber Bragg gratings coupled to said laser diode, said third fiber Bragg grating having a maximum reflectivity at a third wavelength, said fourth fiber Bragg grating having a maximum reflectivity at a fourth wavelength displaced from said third wavelength to define a second wavelength range, said second wavelength range encompassing said first wavelength range each of said third and fourth fiber Bragg gratings generating a feedback signal responsive to said maximum reflectivity of said fiber Bragg grating and said output intensity of said laser diode; and
a controller connected to said laser diode and generating said control signal responsive to said feedback signals from said first and second fiber Bragg gratings to maintain said operating wavelength of said laser diode at a selected wavelength between said first and second wavelengths and responsive to feedback signals from said third and fourth fiber Bragg gratings to maintain said operating wavelength between said third and fourth wavelengths when said operating wavelength is in said second wavelength range but not in said first wavelength range.

25. The laser source of claim 24 comprising a first coupler connected to said laser diode, said first coupler tapping a predetermined fraction of output power from said laser diode for said first and second fiber Bragg gratings.

26. The laser source of claim 25 wherein said predetermined fraction of said output power is much smaller than ½.

27. The laser source of claim 26 wherein said predetermined fraction of said output power is less than 1/10.

28. The laser source of claim 25 comprising a second coupler connected to said first coupler, said second coupler splitting said predetermined fraction of output power from said first coupler into substantially equal fractions, each substantially equal fractions being received by one of said first and second fiber Bragg gratings.

29. The laser source of claim 25 comprising
a second coupler connected to said first coupler, said second coupler splitting said predetermined fraction of output power from said first coupler into substantially equal first fractions; and
third and fourth couplers connected to said second coupler, said third and fourth coupler each receiving said substantially equal first fraction and each splitting said substantially equal first fraction from said second coupler into substantially equal second fractions, said substantially equal second fractions from said third coupler being received by said first and second fiber Bragg gratings.

30. The laser source of claim 24 wherein said first fiber Bragg grating feedback signal corresponds to an output intensity of said laser diode at said first wavelength; said second fiber Bragg grating feedback signal corresponds to an output intensity of said laser diode at said second wavelength.

31. The laser source of claim 30 wherein said controller generates said control signal to equalize said output intensities of said laser diode at said first and second wavelengths.

* * * * *